(12) United States Patent
Houston et al.

(10) Patent No.: US 8,492,205 B2
(45) Date of Patent: Jul. 23, 2013

(54) OFFSET GEOMETRIES FOR AREA REDUCTION IN MEMORY ARRAYS

(75) Inventors: Theodore W. Houston, Richardson, TX (US); Robert R. Garcia, Rockwall, TX (US)

(73) Assignee: Texas Instruments Incorporated, Dallas, TX (US)

( * ) Notice: Subject to any disclaimer, the term of this patent is extended or adjusted under 35 U.S.C. 154(b) by 260 days.

(21) Appl. No.: 12/840,520

(22) Filed: Jul. 21, 2010

(65) Prior Publication Data

US 2011/0020986 A1 Jan. 27, 2011

Related U.S. Application Data

(62) Division of application No. 12/508,948, filed on Jul. 24, 2009, now Pat. No. 8,110,855.

(51) Int. Cl.
*H01L 21/82* (2006.01)
*G06F 17/50* (2006.01)

(52) U.S. Cl.
USPC .......................................... 438/129; 716/55

(58) Field of Classification Search
CPC .. H01L 27/0207; H01L 27/115; G06F 17/5068
USPC ................... 438/128, 129, 106, 982; 716/50, 716/52, 55, 110, 119
See application file for complete search history.

(56) References Cited

U.S. PATENT DOCUMENTS

| | | | | |
|---|---|---|---|---|
| 5,822,214 A * | 10/1998 | Rostoker et al. | | 716/123 |
| 7,709,301 B2 * | 5/2010 | Bosshart | | 438/129 |
| 2005/0044522 A1 * | 2/2005 | Maeda | | 716/18 |
| 2005/0281098 A1 * | 12/2005 | Sadra et al. | | 365/194 |
| 2009/0267124 A1 * | 10/2009 | Bosshard | | 257/296 |

* cited by examiner

*Primary Examiner* — A. Sefer
*Assistant Examiner* — Nikolay Yushin
(74) *Attorney, Agent, or Firm* — Rose Alyssa Keagy; Wade J. Brady, III; Frederick J. Telecky, Jr.

(57) ABSTRACT

An array with cells that have adjacent similar structures that are displaced from each other across a common cell border in a direction that is not perpendicular to the cell border thus avoiding an across cell border design rule violation between the adjacent similar structures. A method of forming reduced area memory arrays by moving adjacent similar structures that is not perpendicular to a fully identical common cell border. A method of building arrays using conventional array building software by forming unit pairs with cells that are not identical and are not mirror images or rotated versions of each other.

11 Claims, 11 Drawing Sheets

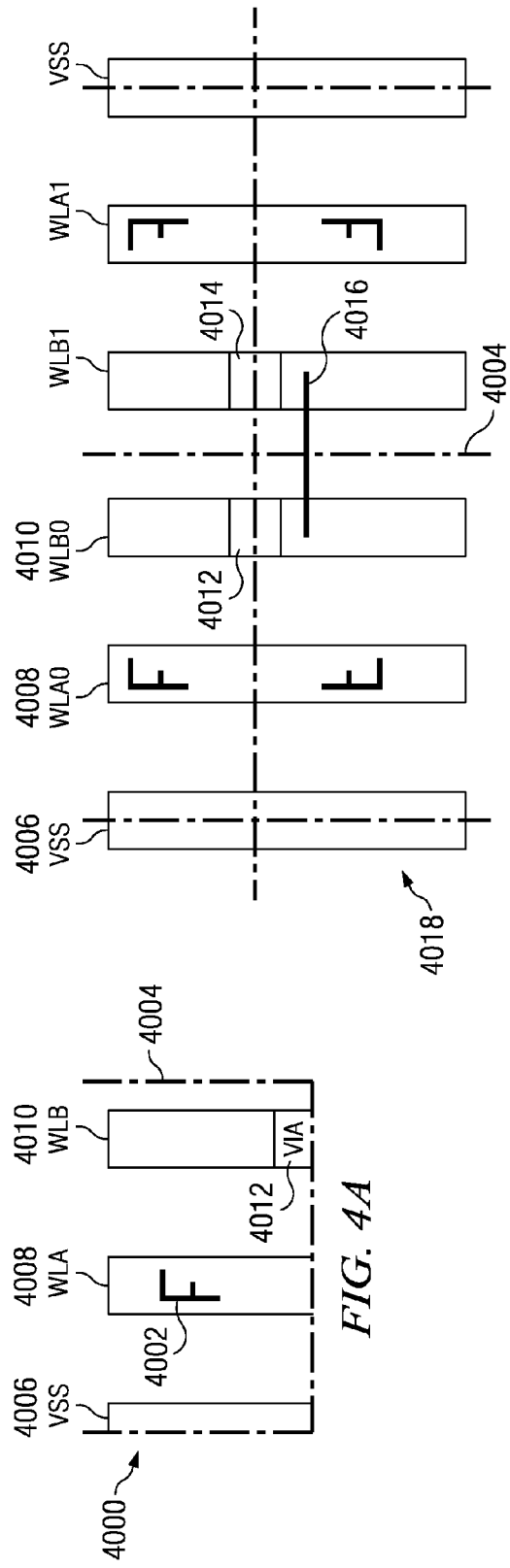
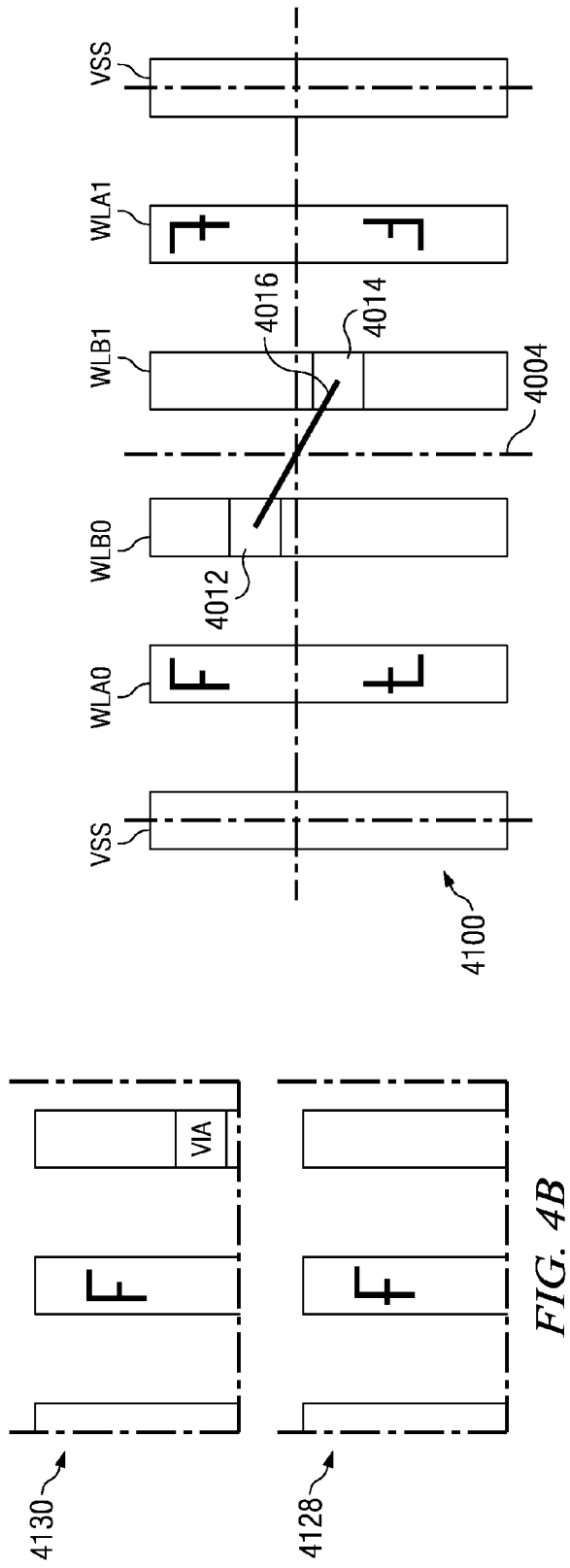
FIG. 4A
FIG. 4B

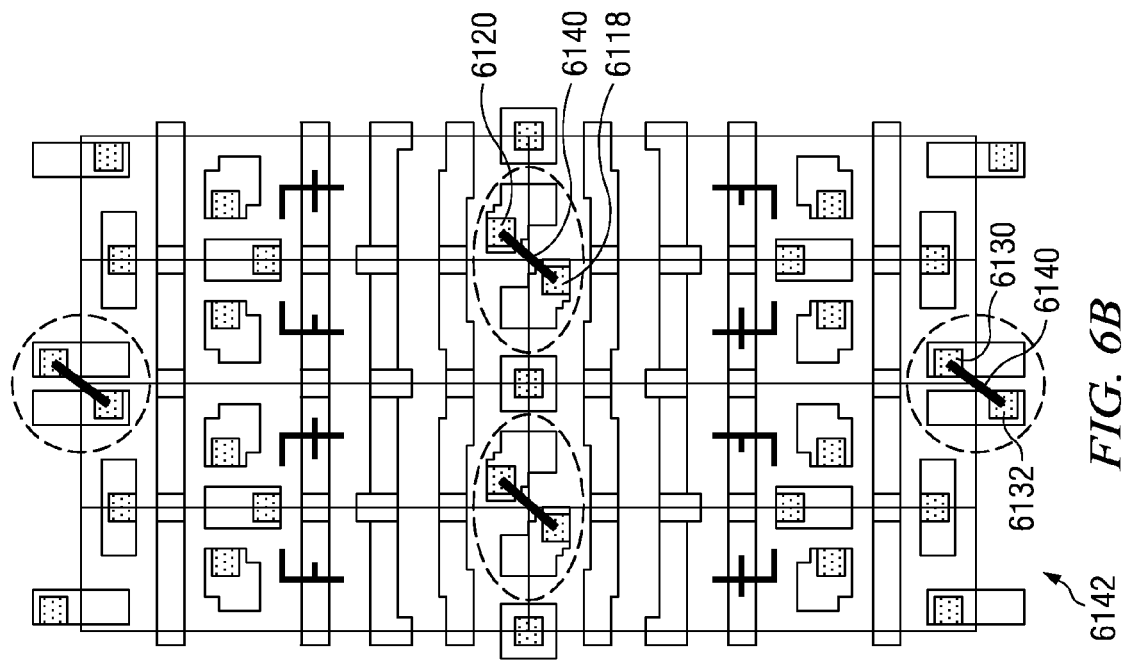
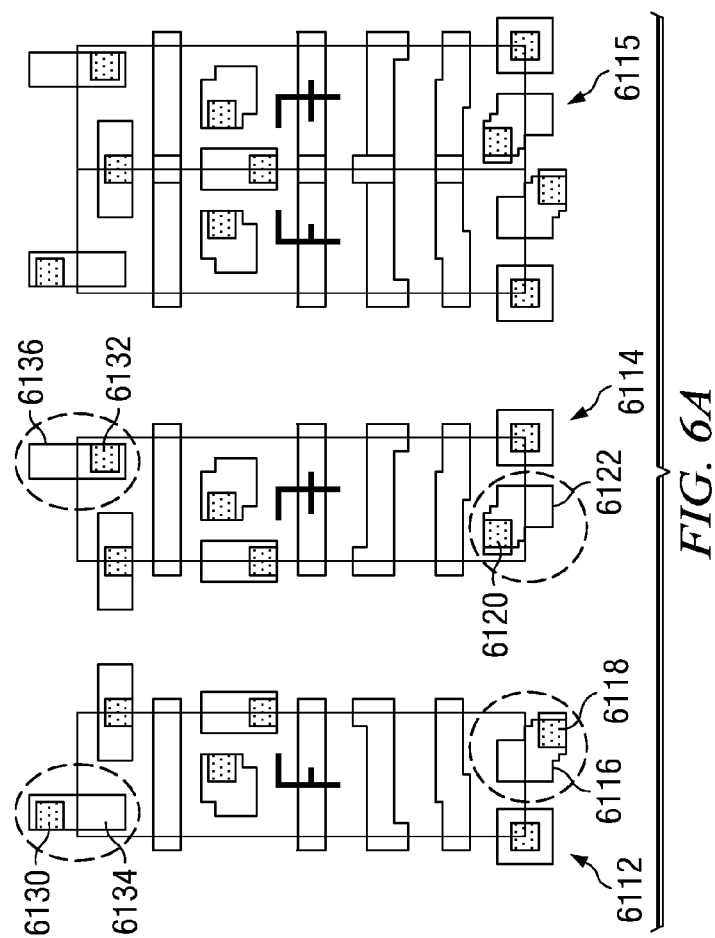
FIG. 6A
FIG. 6B

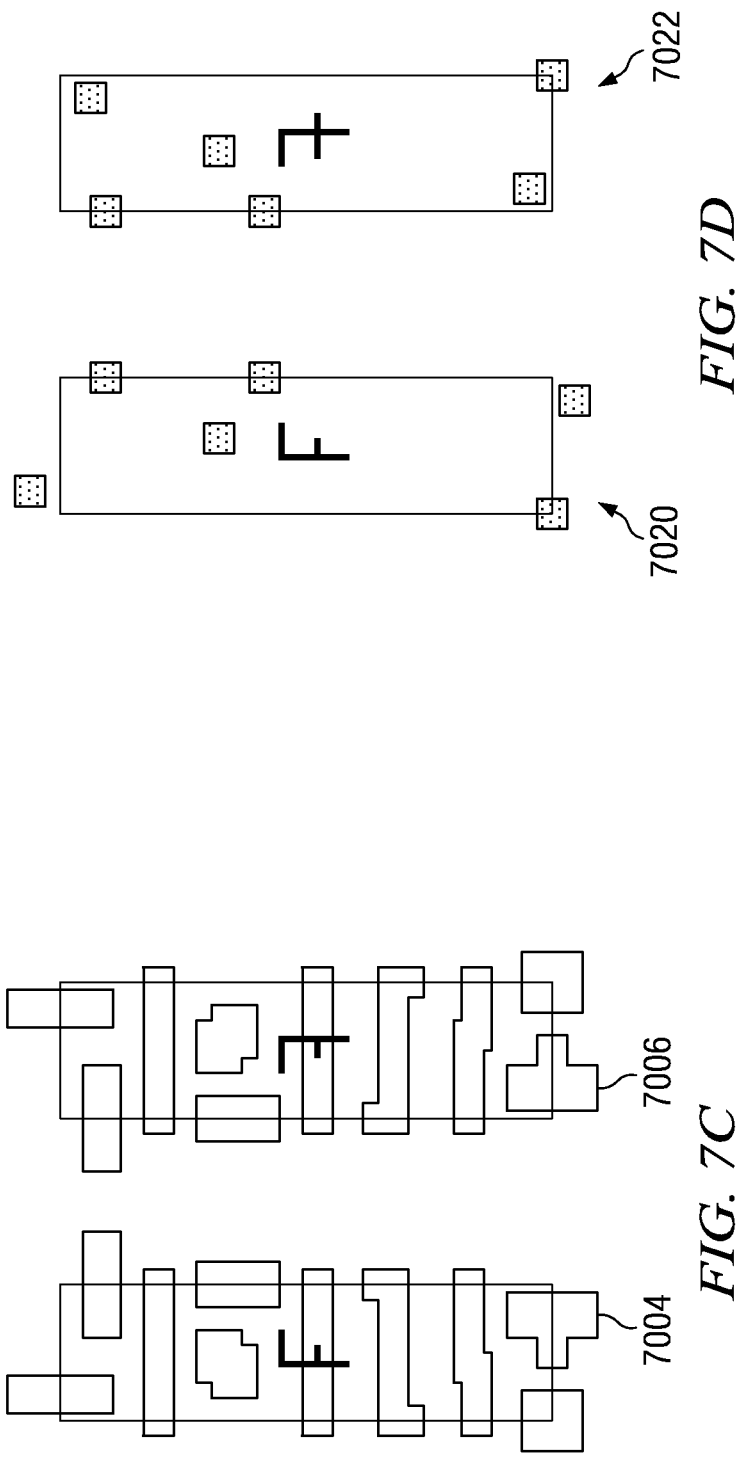

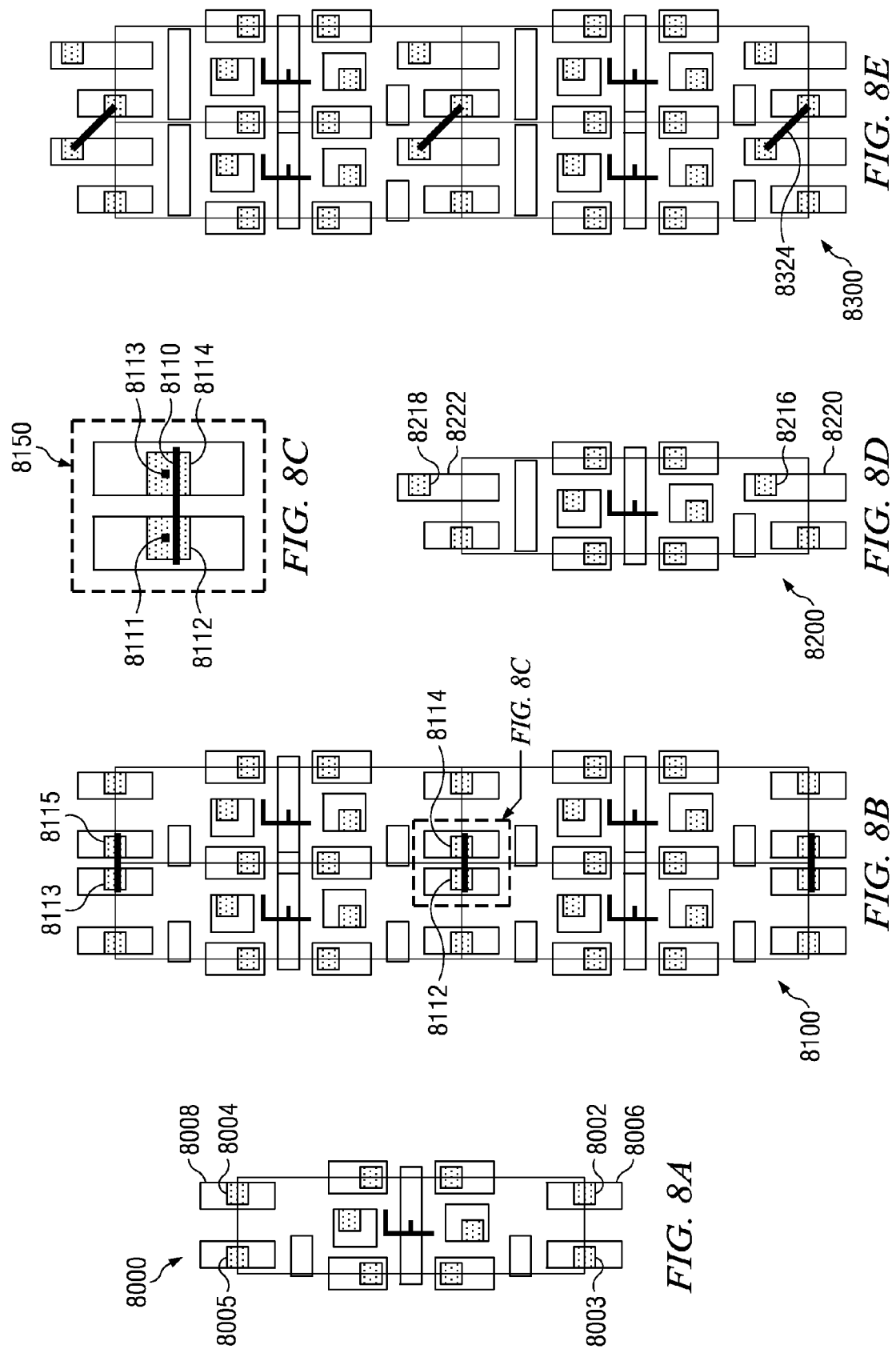

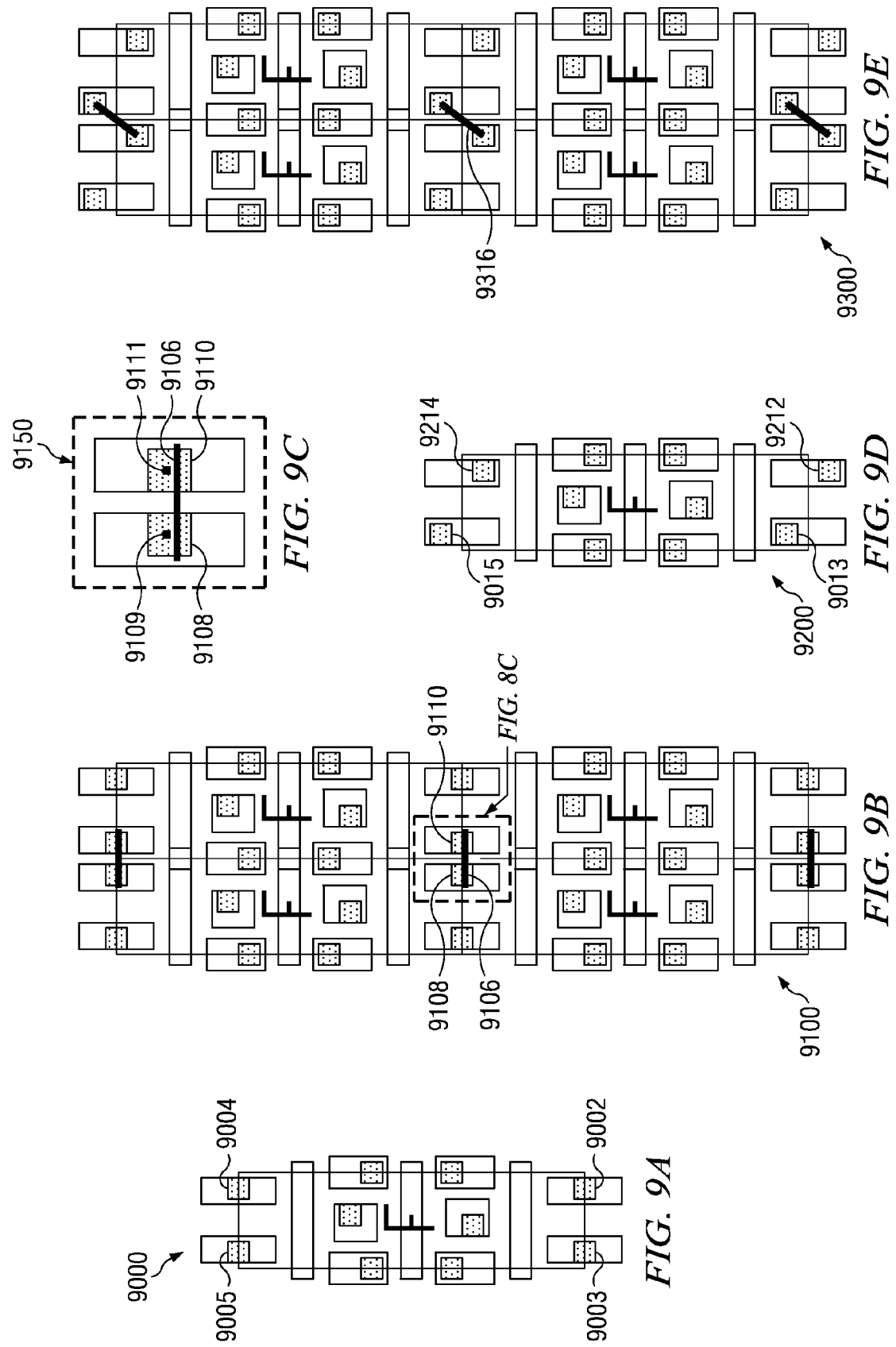

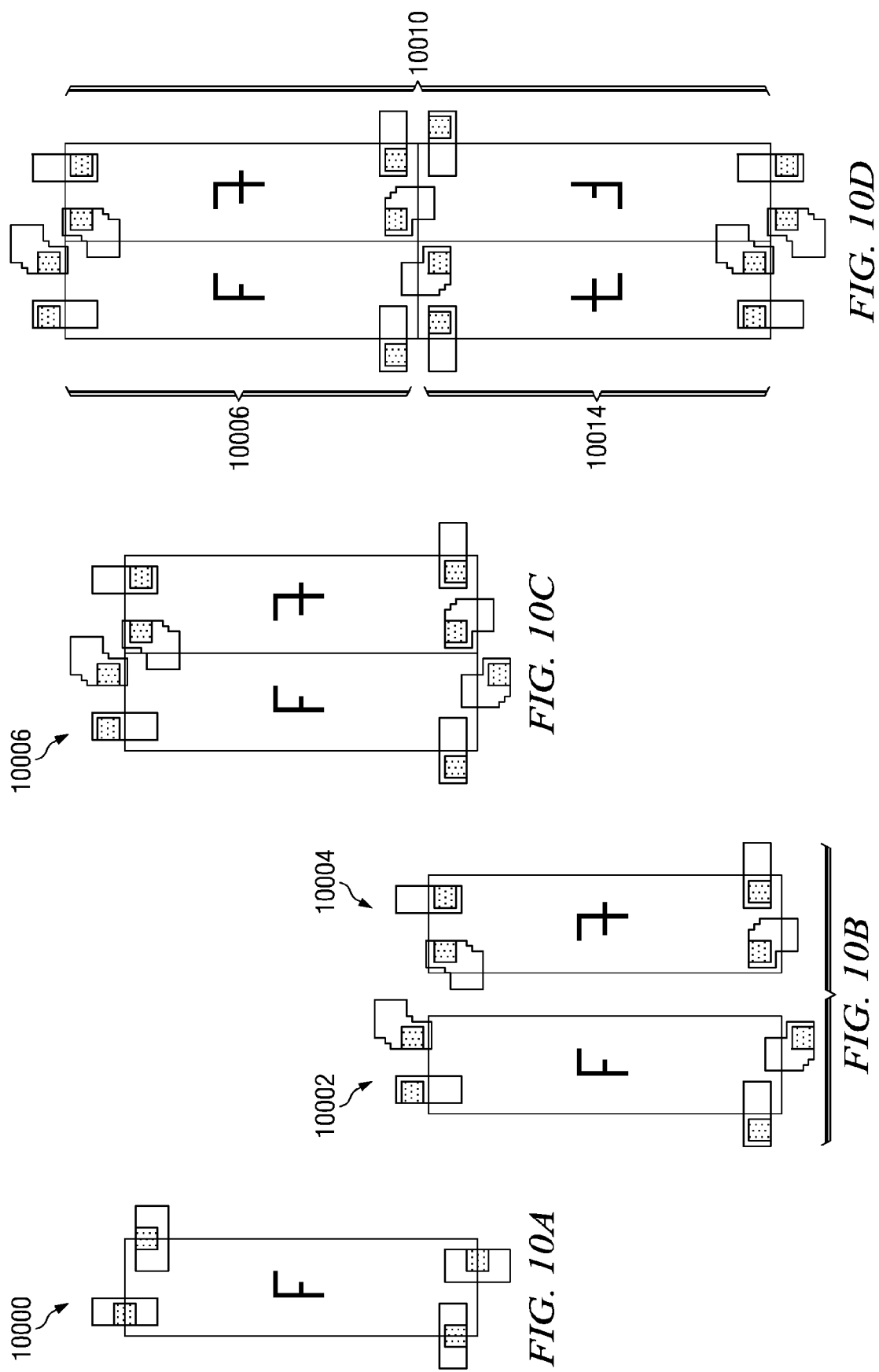

OFFSET GEOMETRIES FOR AREA REDUCTION IN MEMORY ARRAYS

CROSS-REFERENCE TO RELATED APPLICATIONS

This is a division of application Ser. No. 12/508,948, filed on Jul. 24, 2009, the entire disclosure of which is hereby incorporated by reference.

FIELD OF THE INVENTION

This invention relates to the field of integrated circuits. More particularly, this invention relates to layout techniques of memory arrays in integrated circuits.

DESCRIPTION OF THE VIEWS OF THE DRAWING

FIGS. 4A and 4B illustrate the placement of SRAM word-line vias according to one embodiment.

FIGS. 6A and 6B illustrate a method of resolving design rule violations across cell pattern boundaries according one embodiment and also illustrates the formation of a cell pair with mirror image symmetry.

FIG. 7A through 7D illustrate a method of resolving a cell boundary design rule problem while still preserving mirror symmetry for a metal pattern.

FIG. 8A through 8C illustrate across border design rule violations that may occur across a cell border when the same cell is placed multiple times.

FIGS. 8D and 8E illustrate a first method for resolving the design rule violations.

FIG. 9A through 9C illustrate across border design rule violations that may occur across a cell border when the same cell is placed multiple times.

FIGS. 9D and 9E illustrate a second method for resolving the design rule violations.

FIG. 10A through 10D illustrate the formation of a unit pair from two non-identical cells. Also shown is the formation of a stepping unit from a pair and a mirror image f the unit pair that may be placed multiple times to form a memory array.

DETAILED DESCRIPTION

Figure 1:
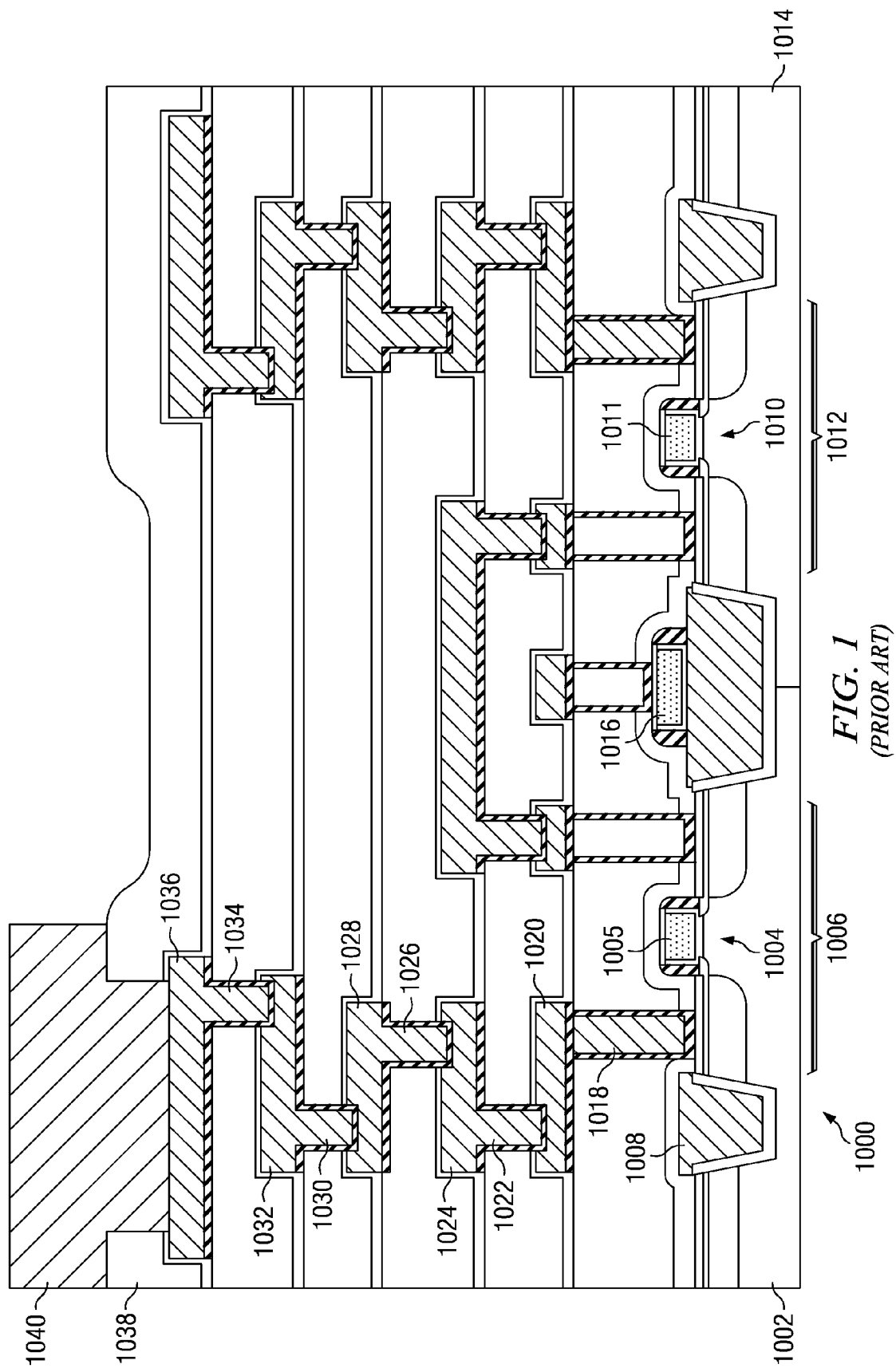
FIG. 1 (Prior art) is a cross-section of an integrated circuit with multiple levels of metal.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The term "cell pattern" refers to pattern that may be placed many times to form an array in an integrated circuit. The cell pattern, or the cell pattern plus mirror image versions of the cell pattern, may be placed adjacent to each other form an array pattern. Some examples of cell patterns include patterning levels for memory cells, such as SRAM, DRAM, FLASH, and FeRAM cells. Patterning levels include active, gate, contact, metal, and via patterns from the aforementioned memory cells.

The term "array pattern" refers to an array formed with two or more cell patterns.

The term "mirror symmetry" refers to the symmetry between an object and the mirror image of that object.

The term "unit pair" refers to two cell patterns that may not be identical and may not be mirror images or a rotation of each other but when placed together form a unit pair with the appropriate symmetry allowing it to be placed multiple times to form an array pattern using conventional placement software.

The term "stepping unit" refers to an array pattern formed from a unit pair and a mirror image of the unit pair. A stepping unit may be placed multiple times without rotation and without mirror reflection to form a large memory array.

The term "adjacent similar structures" refers to two structures that perform a similar function and are adjacent to one another across a common cell border in an array. One of the adjacent similar structures is in a first memory cell and the other adjacent similar structure is in a second memory cell. Examples include two contacts, two vias, two adjacent metal landing pads, two polysilicon structures, or two active structures that are on opposite sides of a common cell border.

When design rule clean cell patterns, or clean cell patterns and mirror images of cell patterns, are placed adjacent to one another to form an array pattern, design rule conflicts may arise across a common cell border. Methods of resolving across cell border design rule conflicts with minimum impact on cell pattern area and array pattern area are described in embodiments below. The method of resolving an across cell border design rule conflict may destroy the symmetry between the two adjacent cells with the result that commonly used cell placement software can no longer be used. A method of combining two non symmetric cells into a unit pair that does have the appropriate symmetry to be placed using commonly used cell placement software is also described below.

A cross section of a portion of a CMOS circuit with multilevel metal is shown in FIG. 1 (1000). The circuit contains a pwell (1002) with active region (1006) in which an nmos transistor (1004) is formed, and an nwell (1014) with active region (1012) in which a pmos transistor (1010) is formed. In addition, the circuit contains contacts (1018), shallow trench isolation regions (1008), and polysilicon lines which form nmos and pmos transistor gates (1005) (1011) and interconnect (1016). Moreover, the circuit includes 5 levels of metal interconnect which include metal 1 (1020), metal 2 (1024), metal 3 (1028), metal 4 (1032), and metal 5 (1036), and via 1 (1022), via 2 (1026), via 3 (1030), and via 4 (1034). A probe pad (1040) is in contact with metal 5 (1036) through an opening that is etched in the protective overcoat layer (1038).

Figure 2:
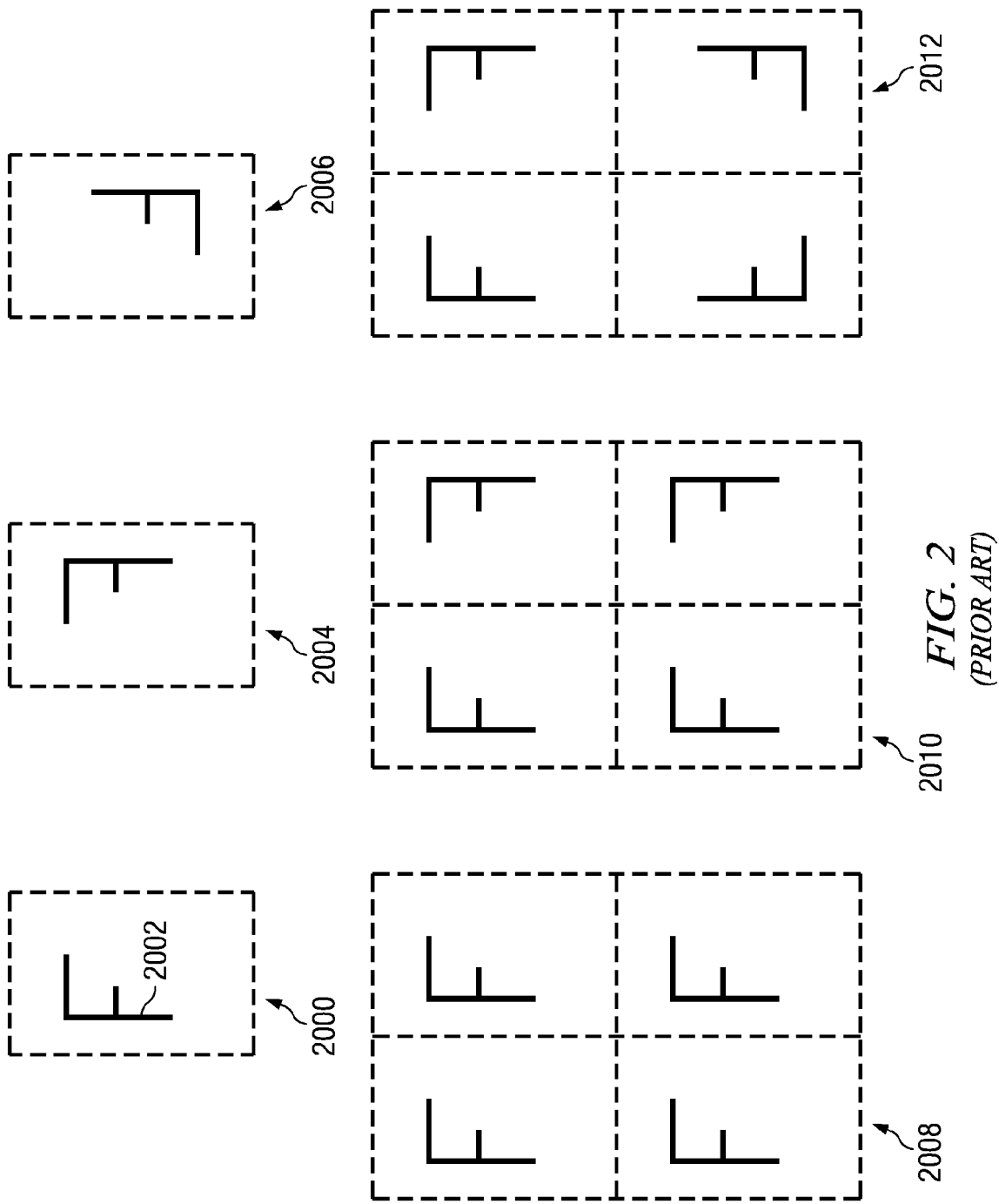
FIG. 2 (Prior art) gives examples of cells, mirror images of cells, rotated cells and examples of array configurations formed from the cells.

FIG. 2 is a diagram of cell patterns (2000), (2004), and (2006) and some representative placements of these cells in array patterns (2008), (2010) and (2012). The letter "F"

(2002) in each cell is not a physical geometry. It is used to keep track of the orientation of the placed cells, including mirror image (2004) of the cell pattern (2002) and rotations (2006) of the cell pattern (2002). Array patterns (2008), (2010), and (2012) are illustrative examples of how cell pattern (2000) and its mirror image (2004) and rotation (2006) may be placed adjacent to one another to form array patterns.

Figure 3:
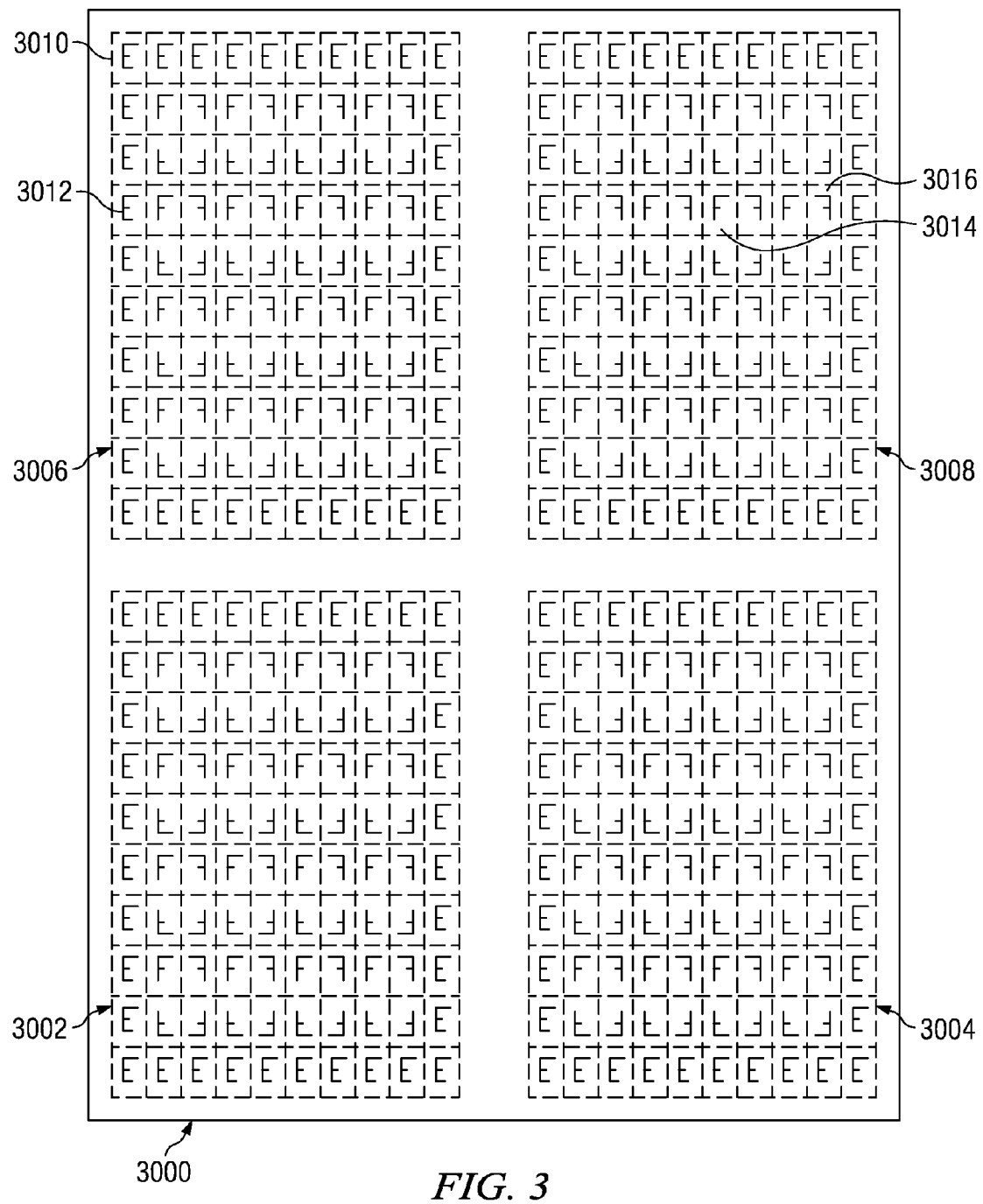
FIG. 3 (Prior art) is an illustration of repetitive blocks of cells in an integrated circuit.

FIG. 3 shows an example of array segments, (3002) (3004) (3006) and (3008) in an array block (3000). Cells interior to the array segments may be composed of cells and mirror images of cells placed in a repetitive manner. Array pattern (2012) of FIG. 2 is used for illustration, but other array patterns including (2008) and (2010) may also be used. An array segment such as (3006) may also have a one or more rows of edge cells (3010) that may or may not be identical to the interior cells, (3014) and (3016). Edge cells may not be electrically active and may be used to provide the interior cells with a more uniform physical environment during manufacturing to reduce process variation. For ease of illustration, the edge cells in FIG. 3 are represented by a single symbol, "E" (3012). A variety of edge cells with a variety of orientations may be used in the formation of an array.

For purposes of illustration, a metal and a via cell pattern from an SRAM cell are used in FIGS. 4, 5, 6, 7, 8, 9 and 10. Other levels such as active (1006) (1012), poly interconnect (1016), or contact (1018) could also be used to illustrate the embodiment. In addition, patterns from another type of memory cell such as DRAM, FRAM or FLASH for example may also be used.

FIG. 4A shows an example of a metal and via pattern (4000) for a dual port SRAM cell which has two wordlines per cell. With two wordlines verses the single word line of a standard 6T SRAM cell, the routing of the word lines of the dual port cell is apt to limit the minimum dimension of the cell in the direction orthogonal to the direction of the wordlines. A similar word line routing limitation on minimum cell dimension occurs in other SRAM cells with two word lines, such as SRAM cells with read buffers and SRAM cells with a separate read word line. Cell pattern (4000) contains a VSS metal line (4006) and two metal wordlines, WLA (4008) and WLB (4010). The unit cell pattern also contains half of a wordline via (4012). The letter "F" (4002) in cell pattern (4000) is used to keep track of the orientation of the cell when it is placed in an array pattern such as (4018) and is not a physical geometry. Likewise the cell border (4004) is not a physical geometry. Array pattern (4018) is formed with four placements of cell pattern (4000); including two mirror images and a rotation. Although there are no design rule violations within cell pattern (4000) a design rule violation does occur between the adjacent similar structure wordline vias (4012) and (4014) across the vertical cell border (4004). Specifically, the via-center to via-center space required by a design rule is indicated by the length of line (4016). The spacing between the centers of wordline vias (4012) and (4014) violates this design rule in array pattern (4018). The resolution of this design rule violation (which preserves the mirror symmetry of the cell patterns in pattern array (4018)) may require that the distance between the center of the wordline via (4012) and the vertical cell border (4004) to be increased. This would increase the width of cell pattern (4000) and therefore also increase the area of the array pattern (4018).

FIG. 4B illustrates a method to resolve the design rule violation without increasing the area of the array according to a first embodiment. By moving an adjacent similar structure wordline via (4012) in one direction parallel to the vertical cell border (4004) and moving an adjacent similar structure wordline via (4014) in the opposite direction parallel to the cell border (4004), more distance is created between the centers of the two adjacent similar structure vias (4012) (4014). In array pattern (4100) the centers of vias (4012) and (4014) now satisfy design rule (4016) but the four cells which form array pattern (4100) are no longer identical or have mirror image symmetry. Specifically, base cells (4130) and (4128) are not identical and are not mirror images or a rotated version of each other. Cell (4128) has an "F" with an extended middle line drawn through it to indicate it no longer shares symmetry with cell (4130) which has an "F" with no extended middle line drawn through it.

Figure 5B:
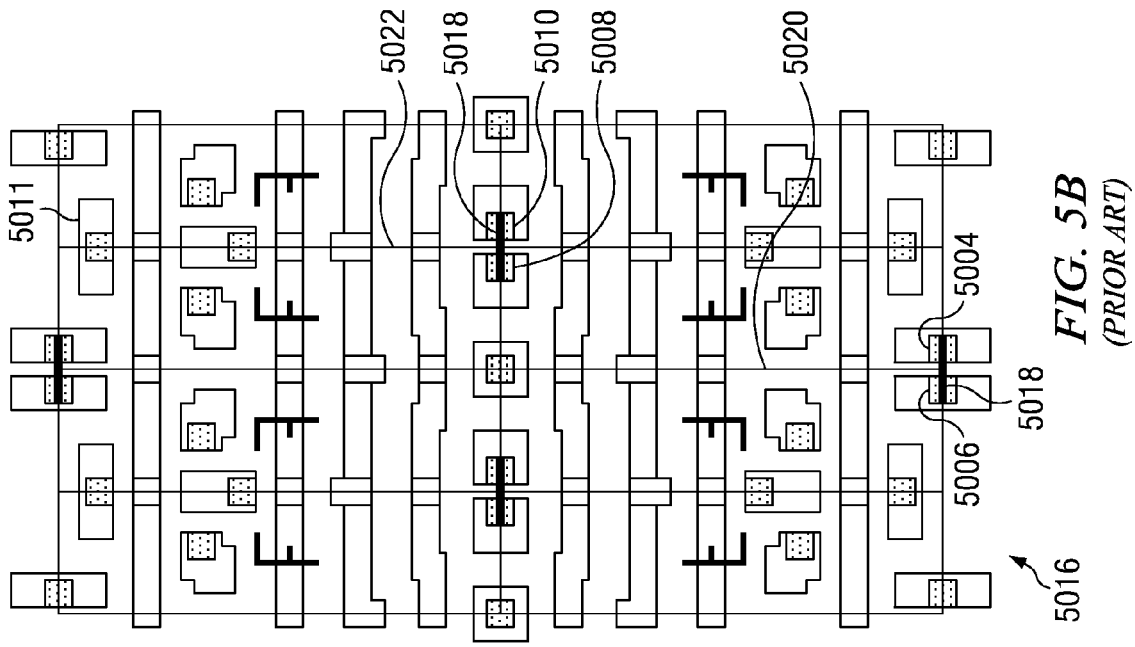
FIGS. 5A and 5B (Prior art) illustrate an example of design rule violations across cell pattern borders.
Figure 5A:
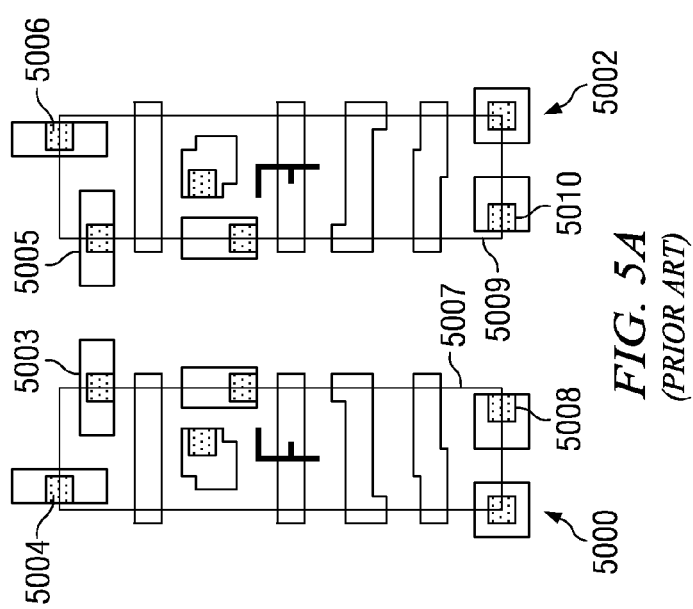

An example metal and via SRAM cell patterns (5000) and (5002) are shown in FIGS. 5A and 5B. In FIG. 5B, array pattern (5016) is formed by placing cell pattern (5000) from FIG. 5A adjacent to cell pattern (5002). (Note that cell pattern (5002) is a mirror image of cell pattern (5000)). Geometries such as (5003) and (5005) which extend across the cell borders, (5007) and (5009), in FIG. 5A merge into one geometry (5011) which straddles the common cell border (5022) in FIG. 5B. The via-to-via center space design rule, indicated by line (5018) in FIG. 5B, is violated in array pattern (5016) for adjacent similar structure vias (5006) and (5004) (across common cell border (5020)) and also for adjacent similar structure vias (5008) and (5010) (across common cell border (5022)). One method to resolve the across cell border via-to-via center space design rule violation that preserves the cell symmetries may be to increase the horizontal width of the array pattern (5016) which increases the cell and array area.

FIGS. 6A and 6B illustrate a preferred embodiment for resolving the design rule conflict across the cell borders, (5020) and (5022), with little or no impact upon cell pattern area and upon array pattern area. The method is to move a first member of the adjacent similar structure vias, (5006) in FIG. 5B, in one direction parallel to common cell border (5020) to become via (6132) in array pattern (6142) in FIG. 6B, and to move the second member of the adjacent similar function vias, (5004) in FIG. 5B, in the other direction parallel to common cell border (5020) to become via (6130) in array pattern (6142) in FIG. 6B. Adjacent similar function vias (6132) and (6130) now satisfy the via-to-via center design rule (6140). Adjacent similar function vias (5008) and (5010) in FIG. 5B may also be moved in opposite directions parallel to common cell border (5022) in array pattern (5016) to become adjacent similar function vias (6118) and (6120) in array pattern (6142) in FIG. 6B. These vias also now satisfy the design rule (6140). With this embodiment, the across cell border design rule violations have been resolved without increasing the area of the array pattern (6142).

Adjacent similar structure metal landing pads (5008) and (5010) in cell patterns (5000) and (5002) in FIG. 5A have been redrawn as (6116) and (6122) in cell patterns (6112) and (6114) in FIG. 6A to accommodate the change in position of adjacent similar structure vias (6118) and (6120). Metal landing pad (6122) is a 180 degree rotated image of metal landing pad (6116).

Moving adjacent similar structures to resolve a design rule violation may destroy the mirror symmetry of cells (such as (5000) and (5002) in FIG. 5A). For example, cells (6112) and (6114) in FIG. 6A are not mirror images of each other. A unit pair (6115) that does have mirror image symmetry may be formed from cells (6112) and (6114). Therefore, this unit pair (6115) in FIG. 6A—plus mirror reflections of this unit pair—may be placed multiple times to form an array pattern such as (6142) in FIG. 6B.

Figure 7B:
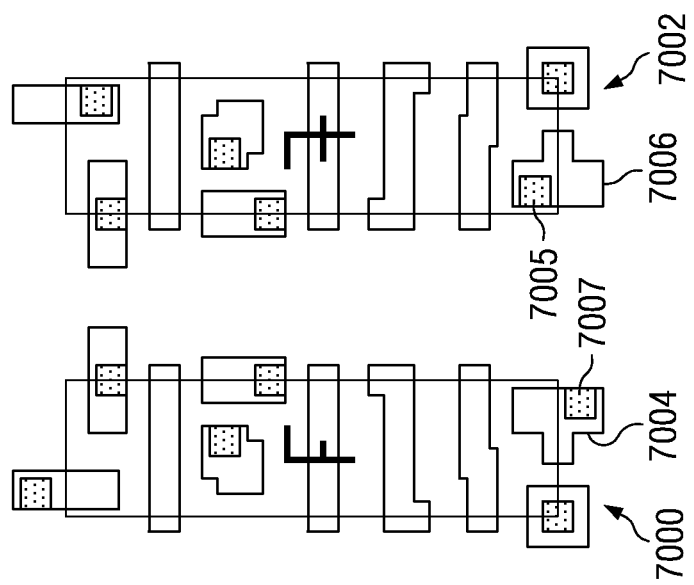
Figure 7A:
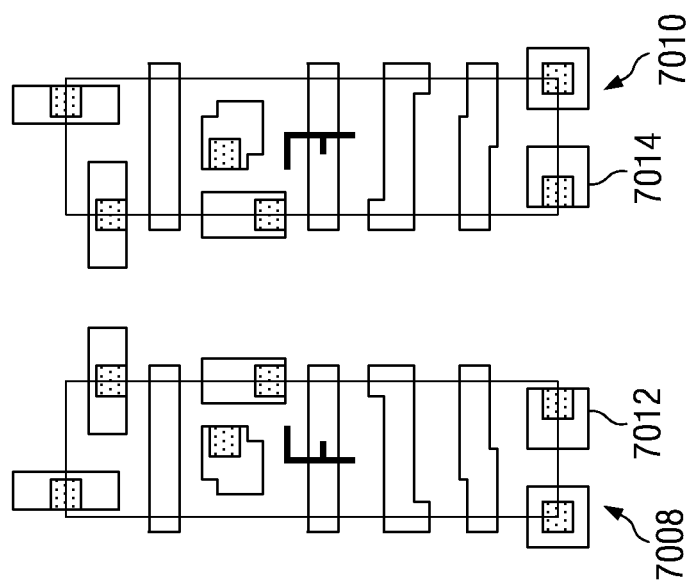

FIGS. 7A through 7D demonstrate a third embodiment. Metal landing pad geometries (7012) and (7014) in cell patterns (7008) and (7010) in FIG. 7A have been redrawn as metal landing pad geometries (7004) and (7006) in cell patterns (7000) and (7002) in FIG. 7B to accommodate the change in the location of the adjacent similar structure vias (7005) and (7007). The metal landing pad geometries in this embodiment have been redrawn to preserve mirror image symmetry. Redrawn metal landing pad (7006) has mirror image symmetry with redrawn metal landing pad (7004), as shown in FIG. 7C. However, as shown in FIG. 7D, the vias of the redrawn cell patterns (7020) and (7022) do not have mirror image symmetry. It is to be noted that it may not always be possible to redraw the metal landing pad geometries to be mirror images. For example, constraints imposed by a via connection to an underlying metal layer may prevent these landing pad geometries from being mirror images of each other after being redrawn to overcome design rule violations.

In the above embodiments, adjacent similar function structures have been moved in opposite directions parallel to a common border between a cell and a mirror image of the cell to illustrate how across cell border design rule violations may be resolved. A similar technique may be used when adjacent similar function structures occur across a common border formed between two identical cells as shown in FIGS. 8A through 8E. Array pattern (8100) in FIG. 8B has been formed from four identical placements of cell pattern (8000) in FIG. 8A. Although there are no design rule violations in cell pattern (8000), a via center to via center design rule (8110) violation occurs between adjacent similar structure vias, (8112) and (8114), in array pattern (8100). As shown in the expanded view (8150) of FIG. 8C, the space between the center (8111) of via (8112) and the center (8113) of via (8114) is less than the via center-to-center design rule length that is indicated by line (8110). According to this embodiment, the adjacent similar structure vias (8002) and (8004) in FIG. 8A—which correspond to vias (8112) and (8113) in FIG. 8B—have been relocated in cell pattern (8200) in FIG. 8D as vias (8216) and (8218) to resolve the across cell border design rule violations. Note that in this embodiment, similar structure vias (8003) and (8005) in FIG. 8A which correspond to similar structure vias (8112) and (8113) in FIG. 8B have not been relocated. In this embodiment only one of the adjacent similar vias (8216) (8218) is relocated to resolve (8324) the across cell border design rule conflict (i.e. the adjacent similar structure vias (8003) and (8005) are not relocated). Metal pads (8006) and (8008) in FIG. 8A have been redrawn as pads (8220) and (8222) in FIG. 8D to accommodate the relocation of vias (8002) and (8004) to vias (8216) and (8218). As with the vias, only one of the adjacent similar metal landing pads (8220) (8222) has been changed (i.e. the adjacent similar metal landing pads corresponding to vias (8003) and (8005) are not changed). Because of design rule and routing constraints in some memory cells, resolving the across border design rule conflict by changing the location or shape of only one of the adjacent similar structures may not be possible. The via center to via center design rule (8324) is satisfied in array pattern (8300) in FIG. 8E that is formed from four placements of cell pattern (8200).

FIGS. 9A through 9E illustrate another embodiment for resolving a design rule violation between adjacent similar structures across a cell boundary between two placements of the same cell. Array pattern (9100) in FIG. 9B has been formed from 4 identical placements of cell pattern (9000) in FIG. 9A. Although there are no design rule violations in cell pattern (9000), a via center (9109) to via center (9111) design rule violation occurs between adjacent similar structure vias, (9108) and (9110), as shown in the expanded view (9150) of FIG. 9C. Specifically, the space between the center of via (9108) and the center of via (9110) is less than the via center to via center design rule length, indicated by line (9106). Therefore, the vias (9002) and (9004) in FIG. 9A have been relocated as vias (9212) and (9214) in FIG. 9D and vias (9003) and (9005) in FIG. 9A have been relocated as vias (9013) and (9015) in FIG. 9D, according to this embodiment to resolve across cell border design rule violations. In this embodiment, the location of the adjacent similar structure vias (such as vias (9214) and (9015)) resolve the across cell border design rule violation when they are placed in array pattern (9300). With this example SRAM cell pattern, there is no need to change the metal landing pads to accommodate the relocation of the vias. The via-to-via center design rule (9316) is satisfied in array pattern (9300) in FIG. 9E (that is formed from four placements of the cell pattern (9200)).

Cell pattern placement software that typically builds arrays by placing one cell pattern and its mirror images may not have the capability to place cell patterns that are not identical or do not have mirror image symmetry. Being able to use this same software to place cells that are not identical (but become part of an array pattern that does have mirror image symmetry and can therefore be placed by this software) saves software development cost and design cost.

FIG. 10A through 10D illustrate an additional embodiment which enables currently available cell pattern placement software to be used to place non identical cell patterns that may be formed according to embodiments described above. Cell patterns (10002) and (10004) in FIG. 10B have been formed from cell pattern (10000) in FIG. 10A using methods previously described to resolve across border design rule violations. Although cells (10002) and (10004) are not identical and are not mirror images or rotated versions of each other, they may be placed together as shown in FIG. 10C to form unit pair (10006). Unit pair (10006) does have the symmetry required to form large arrays with multiple placements of the unit pair (10006) and mirror images or rotations of the unit pair (10006). For example, a stepping unit (10010) may be formed as shown in FIG. 10D from one unit pair (10006) plus one 180 degree rotation (10014) of unit pair (10006). (The 180 degree rotation is equivalent to one horizontal plus one vertical mirror image reflection.) This stepping unit (10010) may be placed multiple times using conventional array building software without rotation or reflection to form a large array.

It is understood that although metal and via patterns of an SRAM cell were used to illustrate the various embodiments supra, they should not limit the scope of the instant invention. Other pattern levels including active (1006) and (1012), gate (1005) and (1011), contact (1018), and other interconnect patterns such as (1020), (1024), (1028), (1032), (1036) and via patterns (1022), (1026), (1030), (1034), for example, are also within the scope of the instant invention. Moreover, the instant invention may be implemented to resolve across cell border design rule conflicts in other memory cell types such as DRAM, FLASH, and FeRAM. Furthermore, the instant invention may be implemented to resolve across cell border design rule conflicts in other repetitively placed structures used to build integrated circuits such as cells in a cell library.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising;
displacing within a first repetitively placed cell a first adjacent similar structure in a direction that is not perpendicular to a fully identical common cell border, also displacing within a second repetitively placed cell a second adjacent similar structure in a direction that is not perpendicular to said fully identical common cell border, to generate sufficient distance between said first adjacent similar structure and said second adjacent similar structure to satisfy a design rule.

2. The method of claim 1 wherein said first and second repetitively placed cells are SRAM memory cells and wherein said first and second adjacent similar structures are wordline vias.

3. The method of claim 1 wherein said first and second repetitively placed cells are SRAM memory cells with two wordlines per said SRAM memory cell and wherein said first and second adjacent similar structures are wordline vias.

4. The method of claim 1 wherein said second repetitively placed cell is a mirror image of said first repetitively placed cell except for said first and second adjacent similar structures.

5. The method of claim 1 wherein said second repetitively placed cell is identical to said first repetitively placed cell.

6. The method of claim 1 wherein said first and second repetitively placed cells are at least one of an SRAM, FLASH, FRAM, and DRAM memory cell.

7. The method of claim 1 wherein said first and second repetitively placed cells are from a cell library.

8. The method of claim 1 further comprising:
changing a shape of said first adjacent similar structure; and
changing a shape of said second adjacent similar structure;
wherein said changed shape of said second adjacent similar structure is a 180 degree rotation of said changed shape of said first adjacent similar structure.

9. The method of claim 8 wherein said first and second repetitively placed cells are SRAM memory cells and wherein said first and second adjacent similar structures are wordline via landing pads.

10. The method of claim 8 wherein said first and second repetitively placed cells are SRAM memory cells with two wordlines per said SRAM memory cell and wherein said first and second adjacent similar structures are wordline via landing pads.

11. A method of forming an array pattern, comprising:
providing a first memory cell pattern and a second memory cell pattern, said second memory cell pattern forming a unit pair with said first memory cell pattern;
forming a stepping unit consisting of one said unit pair plus one 180 degree rotation of said unit pair;
printing said stepping unit multiple times to form said array pattern.

* * * * *